United States Patent [19]

Telser

[11] Patent Number: 5,128,234
[45] Date of Patent: Jul. 7, 1992

[54] PRODUCTION OF PHOTOPOLYMERIC FLEXOGRAPHIC RELIEF PRINTING PLATES

[75] Inventor: Thomas Telser, Weinheim, Fed. Rep. of Germany

[73] Assignee: BASF Aktiengesellschaft, Ludwigshafen, Fed. Rep. of Germany

[21] Appl. No.: 720,064

[22] Filed: Jun. 24, 1991

[30] Foreign Application Priority Data

Jun. 27, 1990 [DE] Fed. Rep. of Germany ....... 4020373

[51] Int. Cl.$^5$ ............................................... G03F 7/30
[52] U.S. Cl. .................................. 430/306; 430/309; 430/331; 430/325
[58] Field of Search ................ 430/306, 309, 331, 325

[56] References Cited

U.S. PATENT DOCUMENTS

| | | | |
|---|---|---|---|
| 4,451,553 | 6/1984 | Fickes et al. ........................ | 430/306 |
| 4,452,819 | 6/1984 | Fickes et al. ........................ | 430/306 |
| 4,725,528 | 2/1988 | Koch et al. ........................... | 430/306 |
| 4,994,344 | 2/1991 | Kurtz et al. .......................... | 430/306 |
| 5,061,606 | 10/1991 | Telser et al. ......................... | 430/306 |

OTHER PUBLICATIONS

IBM Technical Disclosure Bulletin, vol. 18, No. 3, (Aug. 1975) page 715.

*Primary Examiner*—Jack P. Brammer
*Attorney, Agent, or Firm*—Keil & Weinkauf

[57] ABSTRACT

In a novel process for the production of a flexographic relief printing plate from a photosensitive recording element which contains A) a dimensionally stable substrate and
B) at least one photopolymerizable recording layer having
  b$_1$) at least one elastomeric polymer as a binder,
  b$_2$) at least one photopolymerizable monomer which is compatible with the binder (b$_1$) and
  b$_3$) at least one photopolymerization initiator, by
  (1) imagewise exposure of the photopolymerizable recording layer (B) to actinic light and
  (2) washout (development) of the unexposed and therefore nonphotopolymerized parts of the imagewise exposed recording layer (B) with an organic developer with formation of a relief layer, the organic developer used contains, based on its total amount, from 10% to 95% by volume of at least one mineral oil fraction from which aromatics have been removed and which has a boiling range of 150° to 260° C. and a flashpoint above 45° C. and from 90% to 5% by volume of at least one ester of acetic acid with a saturated alcohol where the alkyl radical is of 6 or more carbon atoms and/or with an alkoxy-substituted saturated alcohol where the alkoxyalkyl radical is of 3 or more carbon atoms in total and/or of at least one alkyl and/or alkoxyalkyl glycollate, the boiling point of boiling range of esters being matched with that of the mineral oil fraction from which aromatics have been removed.

10 Claims, No Drawings

PRODUCTION OF PHOTOPOLYMERIC FLEXOGRAPHIC RELIEF PRINTING PLATES

The present invention relates to an improved process for the production of photopolymeric flexographic relief printing plates from photosensitive recording elements which contain A) a dimensionally stable substrate and
B) at least one photopolymerizable photosensitive recording layer having
  $b_1$) at least one elastomeric polymer as a binder,
  $b_2$) at least one photopolymerizable monomer which is compatible with the binder ($b_1$) and
  $b_3$) at least one photopolymerization initiator, by
(1) imagewise exposure of the photopolymerizable photosensitive recording layer (B) to actinic light and
(2) washout (development) of the unexposed and therefore nonphotopolymerized parts of the imagewise exposed recording layer (B) with an organic developer with formation of a relief layer.

Apart from the improvement according to the invention, a process of this type is generally known. The developers which have usually been used are (i) chlorohydrocarbons, such as chloroform, trichloroethylene, tetrachloroethylene or trichloroethane as such or as a mixture with lower alcohols, such as n-butanol;
(ii) saturated cyclic and acyclic hydrocarbons, such as petroleum ether, hexane, heptane, octane, cyclohexane or methylcyclohexane;
(iii) aromatic hydrocarbons, such as benzene, toluene or xylene, or
(iv) lower aliphatic ketones, such as acetone, methyl ethyl ketone or methyl isobutyl ketone.

A disadvantage of all of these known procedures is that the developer has to be allowed to act for a long time in order to achieve a satisfactory washout effect. The relief layers have frequently exhibited surface swelling, or parts of the relief have been underwashed and in certain circumstances mechanically detached. Furthermore, when conventional saturated or aromatic hydrocarbons and ketones are used, long drying times have been necessary, frequently leading to the feared phenomenon of "positive internal finishing", i.e. the finer image elements projecting above the level of solid areas. Not least, these developers, apart from the chlorohydrocarbons, have low flashpoints of less than 21° C., necessitating the use of special explosion-protected plants for carrying out the process. On the other hand, the use of chlorohydrocarbons has given rise to disposal problems, owing to their toxicity. Although these developers have excellent dissolving power, the photopolymeric flexographic relief printing plates which have been produced with the aid of these developers have had an unsatisfactory sidewall structure and a striking, wrinkled surface structure, i.e. the orangepeel effect.

The requirements set for the performance characteristics of photopolymeric flexographic relief printing plates in practice have in the meantime steadily increased. For example, on the basis of present expectations photopolymeric flexographic relief printing plates should be capable of being produced in a particularly simple, environmentally compatible, reliable manner from photosensitive recording elements, should reproduce the original completely true to detail after their production, should be ozone-resistant, should not have a tacky surface, should be resistant to the solvents of the usually used flexographic printing inks under pressure conditions and should give excellent printed copies in a particularly long print run. These requirements are dependent not only on the composition of the particular photosensitive recording elements used but also on the manner in which they are further processed to photopolymeric flexographic relief printing plates. It is therefore essential constantly to develop the conventional procedures to keep pace with the steadily growing practical requirements.

For example, EP-A-0 228 676 (U.S. Pat. No. 4,806,452) discloses a process of the type stated at the outset, in which branched or straight-chain, monoolefinically to triolefinically unsaturated acyclic hydrocarbons, alcohols or ketones of 8 to 15 carbon atoms and/or saturated or monoolefinically to triolefinically unsaturated cyclic aliphatic hydrocarbons, alcohols or ketones of 8 to 15 carbon atoms in the molecule are used as essential components of the organic developers. Examples of suitable hydrocarbons, alcohols or ketones of 8 to 15 carbon atoms are 1-octene, cyclooctane, cyclooctene, cyclooctanol, cyclooctanone, 3-nonene, mono- and sesquiterpenes and terpentine oils. Among these, the monoterpenes, for example p-menthane, borneol, menthone, D- and L-limonene, α-terpineol, α-terpinene, γ-terpinene, terpinolene, α-pinene, β-pinene, δ-pinene and citronellol, are regarded as advantageous. The organic developers, which may contain one or more of these compounds, in particular limonene, may contain up to about 40% by weight, based on the total amount, of other solvents. As such other solvents, the alcohols known from the abovementioned prior art, in particular relatively high boiling alcohols in an amount of up to 20% by weight, are said to be suitable.

Although this known process can be carried out in washers which are not explosion protected and gives good to very good photopolymeric flexographic relief printing plates, the organic developers used in this process have such an intense natural odour that the process can be carried out only in particularly intensively ventilated factory rooms, which constitutes a serious disadvantage.

The process disclosed in EP-A-0 332 070 constitutes a certain advance in this respect. In this known process, hydrogenated mineral oil fractions boiling within a range of 160° to 220° C. and having a flashpoint of greater than 45° C. are used as organic developers. These hydrogenated mineral oil fractions are said to have an aromatics content of less than 1% and a content of naphthenic hydrocarbons of from 0.5 to 50%. Such products are known and conventionally used and are sold, for example, by Exxon under the trade names or trade marks Exxsol D, Nappar, Norpar or Isopar, by Esso under the trade name or trade mark Shellsol D or by Hydrocarbures under the trade name or trade mark Hydrosol P.

It is furthermore stated that these developers can contain alcohols of 4 to 8 carbon atoms, such as n-butanol, n-pentanol, isobutanol or hexanol. The content is said to be not less than 5, preferably 20%, by volume. Moreover, it is stated that in addition surfactants in an amount of up to 2% by weight, or odor-improving additives, such as limonene, pinene or citronellol, in an amount of up to 10% by weight, may be added to this known organic developer.

Although this known process does not give rise to such serious odor problems as the process disclosed in EP-A-0 228 676 and also gives good to very good photopolymeric flexographic relief printing plates which have an excellent surface and no orangepeel and exhibit little or no swelling, the use of these developers leads to relatively long washout times, which is particularly disadvantageous in the washout of thick printing plates, and long drying times result, which is scarcely acceptable in practice. Furthermore, icicling may occur on the surface of the photopolymeric flexographic relief printing plates in certain circumstances, due to undissolved or reprecipitated polymer residues.

U.S. Pat. No. 4,847,182 discloses a variant of the process disclosed in EP-A-0 228 676. In this variant, nonsolvents, such as n-butanol, 2-ethoxyethanol, benzyl alcohol, ethanol, 2-butoxyethanol, isopropyl alcohol, 2-(2-butoxyethoxy)-ethanol, mineral oil, mineral spirits, naphtha, decane or octane, are added to the organic developers, which mainly consist of terpenes. These nonsolvents are said to precipitate the washed-out materials from the particular organic developer used, thus simplifying the working-up thereof. Furthermore, the use of the terpenes and the nonsolvents in the form of aqueous emulsions is recommended. As furthermore disclosed n the Examples of U.S. Pat. No. 4,847,182, large amounts of surfactants must be concomitantly used. Apart from the fact that this process does not solve the problems associated with the intense odor of the terpenes used here, the preparation of the emulsions frequently gives rise to considerable difficulties in practice because they tend to exhibit very pronounced foaming in the washers conventionally used.

EP-A-0 355 789 discloses a process for which the organic developers are selected from the following classes of compounds:
(i) diethylene glycol dialkyl ethers having alkyl groups which contain 1 to 5 carbon atoms;
(ii) esters of acetic acid with saturated alcohols of 6 to 10 carbon atoms or of alkoxy-substituted saturated alcohols of 6 to 10 carbon atoms;
(iii) esters of carboxylic acids of 6 to 10 carbon atoms with alcohols of 1 to 6 carbon atoms and
(iv) esters of alkoxy-substituted carboxylic acids of 2 to 4 carbon atoms, where the alkoxy radical is of 1 to 4 carbon atoms, with an alcohol of 1 to 4 carbon atoms.

Among these, diethylene glycol diethyl ether, 3,5,5-trimethylhexyl acetate, 2-butoxyethyl acetate (butylglycol acetate), 2-ethylbutyl acetate, 2-cyclohexylethyl acetate, 2-ethylhexyl acetate or mixtures thereof, ethyl octanoate, 2-pentyl hexanoate, ethyl nonanoate or ethyl 3-ethoxypropionate are said to be advantageous. Among these in turn, it is said that ethyl 3-ethoxypropionate, mixtures of nonyl acetates, 2-ethylhexyl acetate and diethylene glycol diethyl ether or mixtures of 3,5,5-trimethylhexyl acetate, 2-ethylhexyl acetate and diethylene glycol diethyl ether can be particularly preferably used. Furthermore, these organic developers are said to contain in addition from 5 to 40% by volume or by weight (which is relevant here remains unclear) of alcohols, such as butanol, benzyl alcohol or 2-ethylhexanol.

In practice, the use of the esters as organic developers is very disadvantageous because each member of this class of compounds has its own typical intense fruity ester odor. This intense odor has serious adverse effects on the personnel in the reprographic unit, who after a certain time find the virtually proverbial intense ester odor unbearable. Another disadvantage of the process disclosed in EP-A-0 355 789 is that the organic developers used here result in very pronounced swelling of the developed imagewise exposed recording layers (B) and cause the highly undesirable orangepeel on the printing surface of the photopolymeric flexographic relief printing plates.

These disadvantages also occur in the process disclosed in DE-A-38 36 402, which is supposed to employ esters of the general formula I

where $R^1$ and $R^2$ can be identical or different and are each n- or isoalkyl of 1 to 13 carbon atoms, cycloalkyl of 5, 6 or 12 carbon atoms, alkylaryl where the alkyl radical is of 1 to 3 carbon atoms and the aryl radical is of 6 carbon atoms, or aryl of 6 to 10 carbon atoms, the sum of the carbon atoms in the radicals $R^1$ and $R^2$ being from 6 to 13. In particular, amyl acetate, isoamyl acetate, hexyl acetate, cyclohexyl acetate, ethylhexyl acetate, nonyl acetate, isononyl acetate, propyl propionate, propyl butyrate, butyl butyrate, isobutyl butyrate, benzyl acetate and methyl benzoate are said to be used here, all these being compounds which have an intense odor.

Further processes are disclosed in DE-A-38 36 404 and DE-A-38 36 403.

In the process of DE-A-38 36 404, phenol ethers of the general formula II

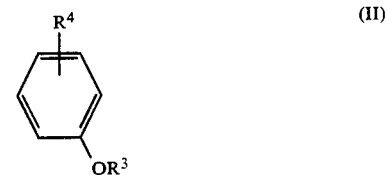

where $R^3$ is n- or isoalkyl of 1 to 6 carbon atoms, cycloalkyl or aryl of 6 to 12 carbon atoms and $R^4$ is hydrogen or n- or isoalkyl of 1 to 6 carbon atoms or a radical $-OR^3$, are said to be used. Among these, methyl phenyl ether, ethyl phenyl ether, isopropyl phenyl ether, propyl phenyl ether, o-cresyl methyl ether, m-cresyl methyl ether, p-cresyl methyl ether, resorcinol dimethyl ether and pyrocatechol methyl ether are supposed to be advantageous.

In comparison, the process of DE-A-38 36 403 employs aromatics of the general formula III

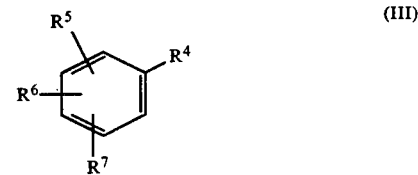

where $R^4$ to $R^7$ may be identical or different and are each hydrogen or n- or isoalkyl of 1 to 5 carbon atoms, and, if they are directly adjacent to one another, $R^4$ and $R^5$ may furthermore form a cycloaliphatic ring having 5 or 6 ring carbon atoms, the latter preferably not being substituted and the sum of the carbon atoms of the substituents and of the ring members being from 9 to 13. Among these, in particular isopropylbenzene, n-propylbenzene, 1-methyl-3-ethylbenzene, 1,3,5-trimethylbenzene, 1-methyl-2-ethylbenzene, 1,2,4-trimethylbenzene, isobutylbenzene, sec-butylbenzene, 1,2,3-trimethylbenzene, 1-methyl-4-isopropylbenzene, indane, indene, 1,3-diethylbenzene, 1-methyl-4-propylbenzene, n-butylbenzene, 1-methyl-3-propylbenzene, 1,2,4,5-tetramethylbenzene, dimethylethylbenzene, methylindene or n-pentylbenzene is used.

Although these two processes make use of compounds which do not have quite such an intense odor as the esters, some of them are nevertheless very unpleasant. Consequently, the particularly intense odor annoyance can be reduced by the esters, although only to a degree. However, there is still the serious disadvantage that the developers of DE-A-38 36 404 and DE-A-38 36 403 are exclusively aromatic solvents which in the end will give rise to more or less major toxicological, occupational hygiene, safety and ecological problems.

Further disadvantages are clear from a consideration of the following technical situation: During washout (development) of the imagewise exposed recording layers (B), the exposed and therefore photopolymerized parts of the recording layer (B) absorb the solvent. This process is usually referred to as swelling. The extent of the swelling can be quantified by separate determination of the increase in layer thickness and/or the increase in the weight of the recording layer (B) completely exposed and therefore treated with the relevant developer. In practice, the swelling of the imagewise exposed and developed recording layers (B), i.e. the relief layers, of the photopolymeric flexographic relief printing plates is generally from 5 to 10% by weight. Converted into layer thicknesses, this means an increase in layer thickness of from 150 to 300 μm, for example in the case of a 3 mm thick photosensitive recording layer (B) or in the case of the relief layer produced therefrom.

The drying is intended to remove the organic developer absorbed by the relief layer of the photopolymeric flexographic relief printing plate. In practice, the error is often made of completely ending the drying when the photopolymeric flexographic relief printing plate or its relief layer has once again reached its initial thickness or its initial weight. The fact that, during washout (development) the original imagewise exposed recording layer (B) not only absorbs organic developers but also exchanges low molecular weight constituents, for example plasticizers or other assistants, for the organic developer is overlooked. Thus, swelling and extraction take place simultaneously, so that the swelling values usually stated reflect not the swelling as such but in reality the sum of swelling and extraction.

If, in the process under discussion, an organic solvent which has a particularly pronounced extraction effect is used, and the photopolymeric flexographic relief printing plates developed therewith are dried to actual constancy of weight or of thickness, which generally requires several days, the weight or the thickness will be substantially smaller than the initial weight or the initial layer thickness, respectively, of the relief layer of the said plate.

If, on the other hand, the photopolymeric flexographic relief printing plates are dried only until the initial weight or the initial layer thickness is reached, in accordance with the conventional procedure, their relief layers inevitably still contain large amounts of organic solvents. These residual solvents are, however, nonuniformly distributed in the relief layers. Thus, fine structures, for example screens having a large surface per unit volume, possess considerably higher swelling values than solid areas. This also applies to the edges of these solid areas, which swell to a greater extent than their center. Consequently, the fine structures and the edges of the solid areas in the relief layer of the photopolymeric flexographic relief printing plate project to a greater extent than, for example, the center of the solid areas. These inhomogeneities and different heights (tolerances) are also caused, and reinforced, in particular, by the nonuniform temperature distribution which is always present in the drier. If these tolerances become widespread in a photopolymeric flexographic relief printing plate, they make the latter useless.

Even if the amount of residual solvent still present does not directly lead to the relevant photopolymeric flexographic relief printing plate becoming useless, it nevertheless causes long-term shrinkage, i.e. the relief layer of the relevant plate changes its dimensions as a result of evaporation of the residual solvent on prolonged storage or prolonged use. Because of the long-term shrinkage, different printed copies are obtained with one and the same photopolymeric flexographic relief printing plate after prolonged storage or use, which is unacceptable in practice. This disadvantage becomes particularly acute in practice when, after prolonged use, one of the four photopolymeric flexographic relief printing plates of a flexographic four-color set can no longer be used and from now on has to be replaced by a relief printing plate which has to be newly produced, is identical in motif and in its dimensions and prints the relevant color separation in a manner exactly matching the other three color separations. However, such rapid replacement is no longer possible when the photopolymeric flexographic relief printing plates of the four-color set have suffered long-term shrinkage, because in this case the newly produced relief printing plate no longer matches the other three in its dimensions. If this is the case, all that remains is the time-consuming and expensive option of producing again all four relief printing plates of the four-color set.

Apart from the fact that it is very desirable to reduce or even to completely overcome any disadvantages of the conventional processes by varying their parameters, in particular the organic developers, it is also necessary to use other methods of measurement in checking the success. Thus, the required duration of drying should not depend on reaching the initial layer thickness or the initial layer weight but on the time when the tolerances of the relief layers of the photopolymeric relief printing plates have reached a minimum value, specification of the tolerances being supplemented by statement of the area and of the number of measuring points on the relief layer. This information in its totality then would give a drying time during which the amount of residual solvent in the said printing plate had reached a value which no longer rendered the said printing plate less usable or completely useless under practical conditions. Without such detailed information, it is impossible to check the success, and comparability of organic developers with one another is not ensured.

In addition, the two prior German Patent Applications P 3908764.6 and P 3908763.8, which have not been previously published, describe processes of the type stated at the outset, in which emulsions of organic developers and water are used. The organic developers used here are chlorohydrocarbons, saturated and/or unsaturated cyclic hydrocarbons, saturated and/or unsaturated acyclic hydrocarbons, petroleum distillates, hydrogenated mineral oil fractions and/or mixtures thereof, provided that they themselves are nonflammable, poorly flammable and/or high boiling. It is also possible to use mixtures of long-chain alkyl esters having alkyl groups of different chain lengths, but these are not specified. These emulsions may furthermore contain from 0.1 to 20% by volume of one or more alcohols, for example n-butanol, n-pentanol, n-hexanol, cyclohexanol, n-heptanol, n-octanol, n-decanol, lauryl alcohol, 3-methyl-3-methoxybutanol, benzyl alcohol or 2,3,5-trimethylhexanol.

It is an object of the present invention further to develop the process stated at the outset in order to obtain a novel, improved process for the production of a flexographic relief printing plate from a photosensitive recording element which no longer has the above-mentioned disadvantages of the prior art, even taking into account exact comparison criteria.

We have found that this object is achieved, surprisingly, by the finding that the combination of two organic developers which are known for the intended use under discussion here and whose boiling points or whose boiling ranges are matched with one another overcomes the specific disadvantages of the organic developers used individually in each case and moreover has surprising advantages which were unexpected in view of the prior art. Particularly surprising was the finding that even the addition of a comparatively small amount of acetic esters to mineral oil fractions from which aromatics have been removed make it possible to achieve the short washout and drying times typical for acetic esters, or even shorter times, without there being an excessive odor annoyance or the photopolymeric flexographic relief printing plates produced using the developer combination exhibiting damage due to swelling.

The present invention accordingly relates to a novel process for the production of a photopolymeric flexographic relief printing plate from a photosensitive recording element which contains A) a dimensionally stable substrate and
B) at least one photopolymerizable recording layer having
  b$_1$) at least one elastomeric polymer as a binder,
  b$_2$) at least one photopolymerizable monomer which is compatible with the binder (b$_1$) and
  b$_3$) at least one photopolymerization initiator, by
(1) imagewise exposure of the photopolymerizable photosensitive recording layer (B) to actinic light and
(2) washout (development) of the unexposed and therefore nonphotopolymerized parts of the imagewise exposed recording layer (B) with an organic developer with formation of a relief layer, the organic developer used here contains, based on its total amount, from 10 to 95% by volume of at least one mineral oil fraction from which aromatics have been removed and which has a boiling range of from 150° to 260° C. and a flashpoint above 45° C. and from 90 to 5% by volume of at least one ester of acetic acid with a saturated alcohol where the alkyl radical is of 6 or more carbon atoms and/or with an alkoxy-substituted saturated alcohol where the alkoxyalkyl radical is of 3 or more carbon atoms in total, the boiling point or boiling range of said ester being matched with the boiling range of the mineral oil fraction from which aromatics have been removed, and/or at least one alkyl and/or alkoxyalkyl glycollate.

The novel, improved process for the production of a photopolymeric flexographic relief printing plate from a photosensitive recording element is referred to below as novel process for brevity.

For the purposes of the present invention, compatible means the property of two or more components being completely miscible with one another and not separating even after prolonged storage.

For the purposes of the present invention, matched means that the relevant boiling points or boiling ranges of two or more compounds or mixtures either do not differ very greatly, i.e. are not more than about 10° to 30° C., from one another, or are roughly or exactly the same, so that the relevant compounds or mixtures can be distilled together in a simple manner.

The feature of the novel process which is essential to the invention is the use of an organic developer combination which has not been used to date for the purpose under discussion here.

The organic developer to be used according to the invention contains, based on its total amount, from 10 to 95% by volume of at least one of the mineral oil fractions specified in detail below and from which aromatics have been removed and from 90 to 5% by volume of at least one of the esters specified in detail below. This means that the composition of the said developer can be varied within wide limits without the particular advantages obtained with the aid of the novel process being lost. Within these wide limits, the composition which contains, based on its total amount, from 40 to 95% by volume of at least one of the mineral oil fractions specified below and from which aromatics have been removed and from 60 to 5% by volume of at least one of the esters specified in detail below has proved useful because it has little odor annoyance in conjunction with a short washout and drying time. The novel process has particular advantages if the organic developer contains from 5 to 20% by volume, based on its total amount, of at least one of the esters specified in detail below. The organic developers of this composition which are to be used according to the invention exhibit particularly little odor annoyance and have short washout and drying times, giving photopolymeric flexographic relief printing plates having excellent relief layers which have no orangepeel effect.

Examples of suitable mineral oil fractions which are to be used according to the invention and from which aromatics have been removed are hydrogenated mineral oil fractions.

Examples of suitable hydrogenated mineral oil fractions to be used according to the invention are mineral spirits which have a boiling range of from 150° to 220° C., a flashpoint above 45° C., an aromatics content of <1%, a content of naphthenic hydrocarbons of 35% and a content of paraffins of >64%; synthetic isoparaffins which have a boiling range of from 180° to 220° C., a flashpoint above 65° C. and a content of paraffins of >99%; n-paraffin fractions which have a boiling range of from 180° to 230° C., a flashpoint above 55° C., an aromatics content of <0.1% and a paraffin content of >99.9%, and hydrogenated mineral oils which have a boiling range of from 220° to 260° C., a flashpoint of 90° C. or higher, an aromatics content of 3% and a content of naphthenic hydrocarbons of 31% and a paraffin content of 66%. Among these, hydrogenated mineral oil fractions which have a boiling range of from 150° to 220° C. are preferred.

These hydrogenated mineral oil fractions are conventional commercial products and are sold by Exxon under the trade name or trade mark Exxsol D, Nappar, Norpar or Isopar, by Esso under the trade name or trade mark Shellsol D or by Hydrocarbures under the trade name or trade mark Hydrosol P.

Examples of suitable esters, to be used according to the invention, of acetic acid with saturated alcohols where the alkyl radical is of not less than 6 carbon atoms are 3,5,5-trimethylhexyl acetate, hexyl acetate, 2-ethylbutyl acetate, isoheptyl acetate, isooctyl acetate, isononyl acetate, 2-cyclohexylethyl acetate, 2-ethylhexyl acetate, mixtures of these or the industrial ester mixtures sold by Exxon under the trade names or trade marks Exxate 600, 700 or 900. Alkyl esters which are particularly preferably used according to the invention are those whose boiling point or boiling range is matched with the boiling range of the particular hydrogenated mineral oil fraction used.

Among the abovementioned alkyl esters, the industrial ester mixture Exxate 700 or 3,5,5-trimethylhexyl acetate is particularly preferably used.

Examples of suitable esters, to be used according to the invention, of acetic acid with alkoxy-substituted saturated alcohols where the alkoxyalkyl radical has not less than 3 carbon atoms in total are 2-methoxyethyl acetate (methylcellosolve acetate), 1-methoxyethyl acetate, 3-methoxypropyl acetate, 2-methoxypropyl acetate, 1-methoxypropyl acetate, 2-ethoxyethyl acetate (cellosolve acetate), 1-ethoxyethyl acetate, n-propoxymethyl acetate, isopropoxymethyl acetate, 4-methoxy-n-butyl acetate, 3-methoxy-n-butyl acetate, 2-methoxy-n-butyl acetate, 1-methoxy-n-butyl acetate, 2-methyl-3-methoxyprop-2-yl acetate, 2-methyl-2-methoxyprop-2-yl acetate, 3-methoxybut-2-yl acetate, 1-methoxybut-2-yl acetate, 2-methoxybut-2-yl acetate, 2-methyl-1-methoxyprop-1-yl acetate, 3-ethoxy-n-propyl acetate, 2-ethoxy-n-propyl acetate, 1-ethoxy-n-propyl acetate, 3-ethoxyprop-2-yl acetate, 2-ethoxyprop-2-yl acetate, 2-n-propoxyethyl acetate, 1-n-propoxyethyl acetate, 2-isopropoxyethyl acetate, 1-isopropoxyethyl acetate, n-butoxymethyl acetate, tert-butoxymethyl acetate, but-2-yloxymethyl acetate, 2-n-butoxyethyl acetate, 3-n-propoxypropyl acetate, 3-isopropoxypropyl acetate, 4-ethoxy-n-butyl acetate, 5-methoxy-n-pentyl acetate, 4-methoxypentyl acetate and 3-methoxypentyl acetate. Alkoxyalkyl esters which are particularly preferably used are those whose boiling point or boiling range is matched with the boiling range of the particular hydrogenated mineral oil fraction used.

Among all these alkoxyalkyl esters, 3-methoxy-n-butyl acetate and 2-n-butoxyethyl acetate are very particularly advantageous.

Examples of suitable alkyl and alkoxyalkyl esters, to be used according to the invention, of glycollic acid are methyl glycollate, ethyl glycollate, n-propyl glycollate, isopropyl glycollate, n-butyl glycollate, sec-butyl glycollate, tert-butyl glycollate, n-pentyl glycollate, 2-pentyl glycollate, 3-pentyl glycollate, 2,2-dimethylprop-1-yl glycollate, 1,1-di-methylprop-1-yl glycollate, 3-methoxy-n-propyl glycollate, 2-methoxyethyl glycollate, 2-ethoxyethyl glycollate, 3-methoxy-n-butyl glycollate and 2-propoxyethyl glycollate. Esters which are particularly preferably used are those whose boiling point or boiling range is matched with the boiling range of the particular hydrogenated mineral oil fraction used.

Among all these glycollates, n-butyl glycollate is particularly advantageous.

The organic developers to be used according to the invention may furthermore contain alcohols which, inter alia, have the purpose of rendering soluble or dispersible, in the relevant organic developer, an alcohol-soluble top layer (C) which may be present on the surface of the photosensitive recording element or its photopolymerizable photosensitive recording layer (B). However, said top layer (C) can also be washed away with the aid of these alcohols in a separate washing or development step, it being advantageous for the novel process to add the alcohol to the organic developer to be used according to the invention, because this permits a separate washing step to be dispensed with.

All alcohols whose boiling point or boiling range is matched with the boiling points or boiling ranges of the particular hydrogenated mineral oil fractions and esters used are suitable for the intended use according to the invention.

Examples of particularly suitable alcohols are n-butanol, n-pentanol, 2-ethylhexanol, isoheptanol, isooctanol, isononanol, 3,5,5-trimethylhexanol, benzyl alcohol, the industrial alcohol mixtures sold by Exxon under the trade names or trade marks Exxal 7, 8 and 9, and the alkoxy-substituted alcohols 2-n-propoxyethanol, 2-isopropoxyethanol, 4-methoxy-n-butanol, 3-methoxy-n-butanol, 4-ethoxy-n-butanol, 2-ethoxyethanol, 2-n-butoxyethanol, 3-methyl-3-methoxy-n-butanol and 5-methoxy-n-pentanol.

The use of alcohols and esters having the same alkoxyalkyl or alkyl radical is very particularly advantageous for the novel process. The resulting organic developers can then be worked up again in a simple manner by vacuum distillation after their use according to the invention without there being any danger of a change in the composition of the distillate compared with the original organic developer as a result of transesterification reactions.

In terms of the method, the novel process has no special features, i.e. the photopolymerizable recording layers (B) of photosensitive recording elements are exposed imagewise in a conventional manner and then developed by washing out the unexposed and therefore nonphotopolymerized parts of the imagewise exposed recording layers (B) with the developers described above and to be used according to the invention, in the known spray, brush and rub washers at from 20° to 60° C., in particular from 20° to 35° C. This alone constitutes an advantage of the novel process which should not be underestimated and which lies in the fact that no explosion protected washers need be used. Furthermore, it is found that the optimum washout times of the novel process are substantially shorter than those of the known procedures and that, in contrast to the known procedures, overwashing, i.e. fragmentation of the material from the relief layer by mechanical action (edge fragmentation) does not occur when the optimum washout times are exceeded. The optimum washout time is the time in which the desired or the maximum relief height is just reached during washout. The photopolymeric flexographic relief printing plates produced by the novel process and their relief layers have more pronounced relief heights and a very good sidewall structure, the surface of these relief layers surprisingly being substantially smoother and more uniform than the surface of relief layers which have been produced by the known procedures. In particular, relief layers produced by the novel process have no orangepeel. Furthermore, swelling of the image elements in the relief layers is substantially less than when conventional developers are used, and the photopolymeric flexographic relief printing plates produced by the novel procedure have substantially less tendency to crack. An additional surprising advantage of the novel process is that even after prolonged operation, no deposits occur in the washers and on the photopolymeric flexographic relief printing plates produced.

When the novel process is carried out, the development step is preceded by conventional imagewise exposure of the photosensitive recording element or of its photopolymerizable recording layer (B) to actinic light having a wavelength λ of from 230 to 450 nm, in particular from 300 to 450 nm. Examples of light sources suitable for this purpose are sunlight, commercial UV fluorescent tubes, medium pressure, high pressure and low pressure mercury lamps, superactinic fluorescent tubes, pulsed xenon lamps, lamps doped with metal iodides and carbon arc lamps.

The development step is followed in the further course of the novel process by drying of the resulting photopolymeric flexographic relief printing plates. Drying is advantageously carried out in driers such as through-circulation driers at above room temperature, in particular above 40° C. Advantageously, drying of the photopolymeric flexographic relief printing plates resulting from the novel process is continued until the tolerances in their relief layers have reached $\leq 20$ μm, in particular $\leq 15$ μm. Thereafter, said printing plates furthermore exhibit no long-term shrinkage, which forms the basis of their excellent reusability.

The tolerances of the relief layers are advantageously determined separately in solid areas of size DIN A3 at 40 measuring points.

The photopolymeric flexographic relief printing plates obtained by the novel procedure can then be halogenated in halogen-containing or halogen-donating baths, subsequently washed in reducing baths and dried again. Alternatively to this treatment or thereafter, said printing plates can furthermore be exposed over the entire surface to actinic light, in particular light having a wavelength λ of $\leq 250$ nm.

Another advantage of the novel process is that it can be successfully carried out using many known photosensitive recording elements suitable for the production of photopolymeric flexographic relief printing plates. Such known photosensitive recording elements comprise A) a dimensionally stable substrate and
B) at least one photopolymerizable photosensitive recording layer which contains
   $b_1$) at least one elastomeric polymer as a binder,
   $b_2$) at least one photopolymerizable monomer which is compatible with the polymeric binder ($b_1$) and
   $b_3$) at least one photopolymerization initiator, and are also referred to, somewhat inaccurately, as flexographic printing plates by those skilled in the art.

The photopolymerizable recording layers (B) of these flexographic printing plates may furthermore contain suitable additives, such as thermal polymerization inhibitors, dyes, pigments, photochromic substances, antihalation agents, plasticizers, antioxidants, antiozonants, agents for improving the relief structure, crosslinking agents, flow improvers, parting agents, fillers and/or reinforcing fillers, in effective amounts, in addition to the essential components ($b_1$), ($b_2$) and ($b_3$). The flexographic printing plates may contain a plurality of these photopolymerizable recording layers (B) one on top of the other and firmly bonded to one another, and these layers (B) may have the same or roughly the same composition or different compositions. In addition, the photosensitive recording element may have a conventional top layer (C) of an alcohol-soluble polymer, for example a polyamide. If the top layer (C) is used, it is directly on the photopolymerizable recording layer (B) of the photosensitive recording element or of the flexographic printing plate.

Another great advantage of the novel process is that the organic developers to be used according to the invention can be successfully employed for many known photopolymerizable photosensitive recording layers (B).

For example, short washout times result in the case of photopolymerizable photosensitive recording layers (B) which contain, as binders ($b_1$), vinylaromatic/alkadiene block copolymers (styrene-isoprene-styrene, styrene-butadiene-styrene, styrene-isoprene-styrene/butadiene, etc.), alkadiene/acrylonitrile copolymers (butadiene/acrylonitrile), fluorine rubbers (vinylidene chloride/hexafluoropropylene copolymers), natural rubbers, silicone polymers, polysulfide rubbers or ethylene/propylene/diene terpolymers.

The photopolymeric flexographic relief printing plates produced by the novel process are very suitable for continuous printing after they have been clamped on printing cylinders. They prove to be extremely stable to the solvents of the flexographic printing inks usually used and give excellent printed copies in a particularly long print run. After use, they can be stored for a long time and then reused without there being any danger of a change in the printed image.

EXAMPLES AND COMPARATIVE EXPERIMENTS

Examples 1 and 2 and Comparative Experiments 1 to 4

Production of photopolymeric flexographic relief printing plates by the novel process (Examples 1 and 2) and by known processes (Comparative Experiments 1 to 4)

General experimental method:

Commercial flexographic printing plates (photosensitive recording elements) were used for Examples 1 and 2 and Comparative Experiments 1 to 4. These contained, as substrate film (A), a 125 μm thick polyethylene terephthalate film, which was coated with a 0.3 μm thick polyurethane adhesion-promoting layer prior to application of the photopolymerizable photosensitive recording layer (B). The 2900 μm thick photopolymerizable photosensitive recording layer (B) of these flexographic printing plates consisted of 82.616% by weight of a block copolymer XYZ having a viscosity number of 164.9 ml/g and a total molecular weight of 190,000 and consisting of, based on XYZ, 10% by weight of polystyrene as the X block, 70% by weight of polyisoprene having a glass transition temperature $T_g$ of $-53°$ C., as the Y block, and 20% by weight of polyisoprene containing 53% by weight of 3,4-structures having a glass transition temperature $T_g$ of $+10°$ C., as the Z block, 5% by weight of white oil S 5000, 5% by weight of a copolymer of α-methylstyrene (10% by weight) and p-methylstyrene (90% by weight), having a weight average molecular weight $M_w$ of $9.10^3$, 3.33% by weight of hexane-1,6-diol diacrylate,
1.65% by weight of hexane-1,6-diol dimethacrylate,
1.2% by weight of benzil dimethyl acetal,
0.198% by weight of 2,6-di-tert-butyl-p-cresol,
1.00% by weight of the ozone protection wax Antilux ® 550 from Rheinchemie and
0.006% by weight of the dye Solvent Black (C.I. 26,150).

The flexographic printing plates furthermore contained a 2 μm thick top layer (C) of an alcohol-soluble polyamide (Makromelt ® 6900 from Henkel). These flexographic printing plates were first preexposed uniformly for 2 minutes through their back in a tube exposure unit, then exposed imagewise for 12 minutes through a test negative placed on the top layer (C) and thereafter developed at 30° C. in the non-explosion-protected drum brush washer nyloflex ® F II from BASF Aktiengesellschaft in the novel manner (Examples 1 and 2) and in the conventional manner (Comparative Experiments 1 to 4), the washout time required for achieving a relief height of 800 μm in each case being determined (=optimum washout time).

The resulting photopolymeric flexographic relief printing plates were then dried in a through-circulation drier at 60° C. The time after which the relief layers had again reached their initial layer thickness (2900 μm) was determined. If at all necessary, drying was then continued until the relief layers of the photopolymeric flexographic relief printing plates reached tolerances of ≦20 μm or below.

The drying time required for this purpose was determined separately for each flexographic printing plate and for each developer, using flexographic printing plates of the size DIN A3 which had been uniformly exposed and otherwise treated as described above, at 40 measuring points at which the layer thickness and the tolerances were measured as a function of the drying time.

The Table gives an overview of the organic developers used and the experimental results obtained.

The experimental results underline the advantageous nature of the organic developers to be used according to the invention, owing to their only moderate odor, they were not as annoying to the operator of the drum brush washer as some of the conventionally used developers. The drying times were short and in some cases shorter than those of the Comparative Experiments. Not least, the photopolymeric flexographic relief printing plates produced by the novel procedure had no orange-peel effect.

The organic developers used in the novel process, in particular the developer of Example 2, could be worked up again in a simple manner by distillation under reduced pressure without an increase in the concentration of a component of the organic developers in the distillate or the occurrence of transesterification reactions. The distillates could therefore be reused directly for the intended use according to the invention.

TABLE

Production of photopolymeric flexographic relief printing plates by the novel (Examples 1 and 2) and conventional (Comparative Experiments 1 to 4) procedures

| Examples | Organic developer Composition Hydrogenated mineral oil fraction [% by vol.] | Acetic ester [% by vol.] | Alcohol [% by vol.] | Odor | Washout time to 800 μm relief height (min) | Drying time to initial layer thickness (h) | Time to reach tolerances ≦20 μm (h) | Surface structure |
|---|---|---|---|---|---|---|---|---|
| 1 | Exxsol D 60[a) [40] | Exxate 700[b) [40] | n-Pentanol [20] | Moderately intense | 5 | 2 | 2 | None |
| 2 | Exxsol D 60[a) [72] | 3,5,5-Tri-methylhexyl acetate [8] | 3,5,5-Tri-methylhex-anol [20] | Moderately intense | 6 | 2 | 2 | None |
| Comparative Experiments | | | | | | | | |
| 1 | Exxsol D 60[a) [80] | — | n-Pentanol [20] | Moderately intense | 12 | 3 | 3 | None |
| 2 | — | Exxate 700[b) [80] | n-Pentanol [20] | Very intense, unpleasant | 7 | 2 | 3 | Orangepeel |
| 3 | Exxsol D 60[a) [80] | — | 3,5,5-Tri-methyl-hexanol [20] | Moderately intense | 13 | 3 | 3 | None |
| 4 | — | 1,3,5-Tri-methylhexyl acetate [80] | 2-Ethyl-hexanol [20] | Very intense, unpleasant | 7 | 2 | 3 | Orangepeel |

[a)]Trade name or trade mark of Exxon
[b)]Industrial ester mixture, trade name or trade mark of Exxon

We claim:

1. A process for the production of a photopolymeric flexographic relief printing plate from a photosensitive recording element which contains
   A) a dimensionally stable substrate and
   B) at least one photopolymerizable recording layer having
      b1) at least one elastomeric polymer as a binder,
      b2) at least one photopolymerizable monomer which is compatible with the binder (b1) and
      b3) at least one photopolymerization initiator, by (1) imagewise exposure of the photopolymerizable photosensitive recording layer (B) to actinic light and (2) washout (development) of the unexposed and therefore nonphotopolymerized parts of the imagewise exposed recording layer (B) with an organic developer with formation of a relief layer, wherein the organic developer used here contains, based on its total amount, from 10 to 95% by volume of at least one mineral oil fraction from which aromatics have been removed and which has a boiling range of from 150° to 260° C. and a flashpoint above 45° C. and from 90 to 5% by volume of at least one ester of acetic acid with a saturated alcohol where the alkyl radical is of 6 or more carbon atoms or with an alkoxy-substituted saturated alcohol where the alkoxyalkyl radical is of 3 or more carbon atoms in total, the boiling point or boiling range of said ester being matched with the boiling range of the mineral oil fraction from which aromatics have been removed, or at least one alkyl or alkoxyalkyl glycollate.

2. A process as claimed in claim 1, wherein the organic developer contains from 40 to 95% by volume of the mineral oil fraction from which aromatics have been removed, from 60 to 5% by volume of the acetic ester or glycollic ester or of a mixture of the acetic and the glycollic esters, the percentages being based on the total amount of said developer.

3. A process as claimed in claim 1, wherein the organic developer contains from 5 to 20% by volume, based on its total amount, of the acetic ester or glycollic ester or of a mixture of the acetic and the glycollic esters.

4. A process as claimed in claim 2, wherein the organic developer contains from 5 to 20% by volume, based on its total amount, of the acetic ester or glycollic ester or of a mixture of the acetic and the glycollic esters.

5. A process as claimed in claim 1, wherein the organic developer contains from 0.1 to 30% by volume, based on its total amount, of at least one high boiling alcohol.

6. A process as claimed in claim 2, wherein the organic developer contains from 0.1 to 30% by volume, based on its total amount, of at least one high boiling alcohol.

7. A process as claimed in claim 3, wherein the organic developer contains from 0.1 to 30% by volume, based on its total amount, of at least one high boiling alcohol.

8. A process as claimed in claim 5, wherein the boiling point or boiling range of the alcohol is matched with the boiling point or with the boiling range of the mineral oil fraction from which aromatics have been removed or of the acetic ester or glycollic ester.

9. A process as claimed in claim 5, wherein the alcohol has the same alkyl or alkoxyalkyl radical as the acetic ester or glycollic ester.

10. A process as claimed in claim 8, wherein the alcohol has the same alkyl or alkoxyalkyl radical as the acetic ester or glycollic ester.

* * * * *

UNITED STATES PATENT AND TRADEMARK OFFICE
CERTIFICATE OF CORRECTION

PATENT NO.   : 5,128,234

DATED        : July 7, 1992

INVENTOR(S)  : Thomas TELSER

It is certified that error appears in the above-identified patent and that said Letters Patent is hereby corrected as shown below:

On the Title page, item [57], column 2, line 27, after "the boiling point"

delete "of" and insert -- or --

Signed and Sealed this

Tenth Day of August, 1993

Attest:

MICHAEL K. KIRK

*Attesting Officer*   Acting Commissioner of Patents and Trademarks